United States Patent
Tao et al.

(10) Patent No.: US 10,685,839 B2
(45) Date of Patent: Jun. 16, 2020

(54) METHOD FOR IMPLEMENTING AND REGULATING PATTERNING OF A GRAPHENE FILM BY ULTRAVIOLET PHOTO-OXIDATION

(71) Applicant: SHANGHAI JIAO TONG UNIVERSITY, Shanghai (CN)

(72) Inventors: Haihua Tao, Shanghai (CN); Xianfeng Chen, Shanghai (CN); Yixuan Wu, Shanghai (CN); Shubin Su, Shanghai (CN); Huan Yue, Shanghai (CN); Hao Li, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 16/317,555

(22) PCT Filed: Oct. 18, 2016

(86) PCT No.: PCT/CN2016/102338
§ 371 (c)(1),
(2) Date: Jan. 13, 2019

(87) PCT Pub. No.: WO2018/010330
PCT Pub. Date: Jan. 18, 2018

(65) Prior Publication Data
US 2019/0287803 A1    Sep. 19, 2019

(30) Foreign Application Priority Data
Jul. 12, 2016  (CN) .......................... 2016 1 0546722

(51) Int. Cl.
*H01L 21/04* (2006.01)
*H01L 21/308* (2006.01)
(Continued)

(52) U.S. Cl.
CPC ............ *H01L 21/042* (2013.01); *H01L 21/02* (2013.01); *H01L 21/3065* (2013.01); *H01L 21/3081* (2013.01); *H01L 29/1606* (2013.01)

(58) Field of Classification Search
CPC ... H01L 21/042; H01L 21/02; H01L 21/3081; H01L 21/3065; H01L 29/1606; H01L 21/02236; H01L 51/00
See application file for complete search history.

(56) References Cited

U.S. PATENT DOCUMENTS

| 2010/0028559 | A1* | 2/2010 | Yan ........................ B82Y 25/00 427/558 |
| 2010/0178464 | A1* | 7/2010 | Choi ...................... B82Y 30/00 428/156 |

FOREIGN PATENT DOCUMENTS

JP          61051920 A  *  3/1986  ............. B82Y 40/00

OTHER PUBLICATIONS

Mod et al. (JP 61051920 A) Machine Translation (Year: 1996).*
(Continued)

*Primary Examiner* — Nadine G Norton
*Assistant Examiner* — Mahmoud Dahimene
(74) *Attorney, Agent, or Firm* — Dragon Sun Law Firm, PC; Jinggao Li, Esq.

(57) ABSTRACT

There is provided a method for implementing and regulating patterning of a graphene film by ultraviolet photo-oxidation, including: implementing patterning of a graphene film micron structure pattern by using a xenon lamp excimer ultraviolet photo-oxidation vacuum apparatus and a hard mask; 2: controlling oxygen excitons, by applying a non-uniform magnetic field on the surface of the graphene film in a vertical direction, to move toward the graphene film in a direction of a magnetic field, so as to enhance the directivity of etching to the graphene film in the vertical direction, thereby improving patterning quality of the graphene film (Continued)

with micron-structure; and (3) by adjusting the intensity and direction of the magnetic field moving direction of the oxygen excitons is controlled, and the shape of the etched pattern structure of the graphene film is controlled, and thus controlling the patterning of the graphene film may be achieved.

9 Claims, 3 Drawing Sheets

(51) Int. Cl.
      *H01L 21/3065*    (2006.01)
      *H01L 21/02*       (2006.01)
      *H01L 29/16*       (2006.01)

(56) References Cited

OTHER PUBLICATIONS

International Search Report of PCT/CN2016/102338.
Written opinion of PCT/CN2016/102338.
RO/101 of PCT/CN2016/102338.

\* cited by examiner

METHOD FOR IMPLEMENTING AND REGULATING PATTERNING OF A GRAPHENE FILM BY ULTRAVIOLET PHOTO-OXIDATION

CROSS-REFERENCE TO RELATED APPLICATIONS

This application is a national stage application of PCT Application No. PCT/CN2016/102338. This application claims priority from PCT Application No. PCT/CN2016/102338, filed Oct. 18, 2016, and CN Application No. 201610546722.6, filed Jul. 12, 2016, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

TECHNICAL FIELD

The present disclosure relates to the technical field of manufacturing graphene film, and relates to a method for implementing and regulating patterning of a grapheme film by ultraviolet photo-oxidation.

BACKGROUND

Graphene films have excellent carrier mobility, wide-band optical transmittance, thermal conductivity and flexibility. As a novel material, grapheme films have important application prospects in the field of photonics and optoelectronics, such as flexible display devices, detectors, solar cells and so on. From appearance of single-layer graphene electronic components to the industrialization of graphene films, one of the keys is the development of patterning of the graphene film, that is, the preparation of cells and arrays with certain geometric or functional structures, which is necessary for fundamental research on graphene as well as the industrial application of large-scale integrated devices such as photonics and optoelectronics.

At present, the following methods are mainly adopted for patterning of the graphene film:

(1) micro/nano structure patterns are prepared by electron beam exposure or micro-nano processing techniques such as optical exposure and reactive ion etching. This method may realize pattern precision of several nanometers by developing the patterning of graphene film, and thus is widely used in advanced fundamental science research. However, this method takes the surface of a graphene spin-coated with organic photoresist as a photosensitive layer, which inevitably introduces organic gel contamination and thus making the graphene film worse. In addition, this method for developing the patterning of graphene film is complicated and expensive, and thus has not been adopted by enterprises in the industrialization process of graphene film.

(2) patterning of graphene film by "direct writing" with laser. This method utilizes a laser beam to directly etch a pattern on a graphene film, which has a simple operation and a fast etching rate and may protect from photoresist contamination, and thus is favored by enterprises in the industrialization process of graphene film. However, when the laser propagates in free space, it generally has a spot of several tens of micrometers, which may directly affect the line width and precision of the etched graphene film pattern. In order to obtain high-quality graphene film patterns, pulsed lasers with high-performance are adopted whenever possible, such as the use of expensive femtosecond lasers in science research. At present, the size of pattern structure obtained by the production enterprise such as 2d Carbon by using picosecond pulse laser etching is generally above 30 μm. In addition, during the patterning process performed on the graphene film by pulsed laser, it also etches a certain surface of the substrate supporting the graphene film, which not only pollutes the graphene film to a certain extent, but may also impact the applications in the field of photons and optoelectronics negatively.

(3) the hard mask is disposed on the graphene film, and the patterning thereof is directly performed by reactive ion etching. This method was recently proposed by Keong Yong et al., which is capable of implementing a pattern structure in tens of micrometers (Scientific Reports, Vol. 6, 24890, 2016). However, due to the undercut effect of the etched ions, the graphene film obtained by this method has defects in the range of about twelve micrometers from the edge. In addition to that, reactive ion etching may also damage the substrate material. In addition, the reaction area of a reactive ion etching apparatus is generally in a range of several inches, which may cause new and difficult problems in technical terms for large-area of graphene film patterning with tens of inches, and it is not suitable for industrialization promotion due to the expensive price.

Ultraviolet photo-oxidation methods are widely used for cleaning substrate materials. It uses vacuum ultraviolet light to decompose oxygen molecules to oxygen excitons and ozone, etches organic materials or carbon family materials by using strong oxidizing properties of the oxygen excitons, and releases gas of carbon dioxide or carbon monoxide. In the past few years, ultraviolet photo-oxidation methods are used for modifying the graphene film to obtain graphene with certain nanostructure and oxygen-containing functional groups. However, compared with reactive ion etching, ultraviolet photo-oxidation has weak reaction intensity at room temperature, which is not suitable for patterning of large-area graphene films. In order to increase the strength of the ultraviolet photo-oxidation etching, a self-developed ultraviolet photo-oxidation high vacuum equipment (ZL201210462171.7, ZL201210442424.4) is adopted, which significantly increases the strength of oxidation etching for the graphene film by heating the substrate to 120° C. However, due to the enhanced oxygen exciton diffusion ability during high-temperature ultraviolet photo-oxidation, the pattern structure of the graphene film is highly distorted, and the surface of the graphene near the edge is severely damaged. The xenon lamp excimer light source may emit ultraviolet light with wavelength of 172 nm, which may oxidize most of the organic molecules and has stronger oxidizing, and thus may etch eight to ten layers of graphene at room temperature.

In the present disclosure, the patterning of the graphene film with micron structure is realized by using a xenon lamp excimer ultraviolet photo-oxidation. In order to further improve the steepness of pattern structure of the graphene film and reduce the damage of etching of the oxygen excitons to the graphene at the bottom of the mask along the direction of the graphene film, the motion directivity of the oxygen excitons in a vertical direction is restrained by applying a magnetic field in the vertical direction, and thus the damage caused by etching of the oxygen exciton to the graphene film is reduced, improving the quality of the graphic structure of the graphene film. By using the magnetic field to regulate the moving direction of the oxygen excitons, a pattern with a pattern structure different from that of the mask pattern may be obtained, and thus the purpose of adjusting the graphic structure of the graphene film may be achieved.

Therefore, a heretofore unaddressed need exists in the art to address the aforementioned deficiencies and inadequacies.

SUMMARY

The present disclosure provides a method for implementing and regulating patterning of a graphene film by ultraviolet photo-oxidation, comprising the steps of:

Step 1: disposing a hard mask with a micron-scale pattern structure closely on a $SiO_2/Si$ substrate transferred with a graphene film;

Step 2: disposing the $SiO_2/Si$ substrate transferred with the graphene film and the hard mask in the Step 1 on a sample holder of a xenon lamp excimer ultraviolet photo-oxidation vacuum apparatus, and adjusting the distance between the sample holder and a lower surface of a xenon lamp excimer discharge tube and controlling the oxygen pressure of the xenon excimer ultraviolet photo-oxidation vacuum apparatus;

Step 3: disposing a permanent magnet or other magnetic field generating devices under the $SiO_2/Si$ substrate or at peripheral thereof, so that a direction of the magnetic field is perpendicular to or parallel to a surface of the graphene film;

Step 4: regulating etching process for the graphene film by changing intensity and the direction of the magnetic field in the Step 3 to obtain patterns with different pattern structures.

Preferably, the material of the hard mask in the Step 1 is any one of metal, ferromagnetic material, semiconductor and insulator, and the thickness of the hard mask is related to the pattern structure of the hard mask.

Preferably, the xenon lamp excimer ultraviolet photo-oxidation vacuum apparatus in the step 2 comprises: a vacuum chamber, the xenon lamp excimer discharge tube and the sample holder; the xenon lamp excimer discharge tube and the sample holder are located in the vacuum chamber, and the sample holder is located under the xenon lamp excimer discharge tube; and inlets and outlets for oxygen and nitrogen provided at a side of the vacuum chamber respectively.

Preferably, a wavelength of ultraviolet light emitted by the xenon lamp excimer discharge tube in the Step 2 is 172 nm, and the inside of the vacuum chamber is filled with gases of nitrogen and oxygen, wherein the oxygen pressure does not exceed 100 Pa.

Preferably, the permanent magnet in the Step 3 is neodymium iron boron, wherein a S pole or a N pole of the permanent magnet is disposed to face the graphene film, and the paramagnetic oxygen excitons and oxygen are controlled to move toward the graphene film in the direction of the magnetic field, while the diamagnetic ozone molecules and nitrogen are controlled to move in the opposite direction.

Preferably, the hard mask in the Step 1 is made of a hard material which is opaque in a vacuum ultraviolet band, and the surface and side walls of the hard mask are smooth; if a magnetic field perpendicular to the surface of the graphene is applied, the hard mask is also made of a material transparent to the vacuum ultraviolet band as the magnetic field has a binding ability to the oxygen excitons.

Preferably, in the Step 4, the moving direction and the moving speed of oxygen excitons and oxygen are varied by a non-uniform magnetic field, so that an ultraviolet photo-oxidation process is regulated to obtain a graphene film pattern with a pattern structure different from that of the hard mask.

Compared with the prior art, the present disclosure has the following advantages:

1. the present disclosure implements patterning of a graphene film by using a xenon lamp excimer ultraviolet photo-oxidation method; by applying a non-uniform magnetic field on the surface of the graphene film in a vertical direction, the movement of the oxygen excitons to the graphene film along the direction of the magnetic field is controlled, and thus the directivity of the etching to the graphene film in the vertical direction is enhanced, improving the quality of the graphic structure of the graphene film; and the shape of the structure of the graphene film pattern can be effectively controlled by changing the intensity and direction of the magnetic field.

2. in the present disclosure, a xenon lamp excimer discharge tube is used, which emits ultraviolet light with a wavelength of 172 nm and has a strong oxidizing at room temperature when the content of oxygen in the chamber is less than 100 Pa, and thereby patterning of the graphene film is implemented.

3. the method of the present disclosure may implement and regulate patterning of graphene film at room temperature, which has advantages of high pattern precision (several micrometers), clean, convenience and low cost, and thus it is suitable for patterning large-area graphene film, and thereby has important industrial application prospects in the field of integrated devices such as photonics, optoelectronics and electronics.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

Other features, objects, and advantages of the present disclosure will become apparent by reading the following detailed description to the non-limited embodiments with reference to the drawings.

Figure 1:
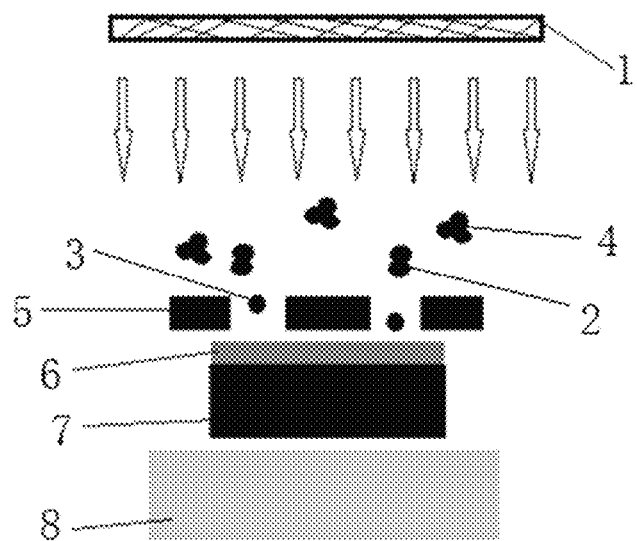
FIG. 1 is a schematic diagram showing the principle for implementing and regulating patterning of a graphene film by using a xenon lamp excimer ultraviolet photo-oxidation method.

In the drawings:
1—xenon excimer discharge tube; 2—oxygen molecule; 3—oxygen atom;
4—Ozone molecule; 5—hard mask; 6—graphene film; 7—$SiO_2$/Si substrate; 8—permanent magnet.

DETAILED DESCRIPTION

The disclosure will now be described in details in connection with the embodiments. The following embodiments are intended to for facilitating those skilled in the art to understand the invention, instead of limiting the invention in any way. It should be noted that a number of variations and modifications may be made by those skilled in the art without departing from the inventive concept, all of which fall within the scope of protection of the present disclosure.

The disclosure comprises three portions: (1) performing patterning of the graphene film by using a xenon lamp excimer ultraviolet photo-oxidation method and a hard mask; (2) controlling oxygen excitons, by applying a non-uniform magnetic field on the surface of the graphene film in a vertical direction, to move toward the graphene film in a direction of magnetic field, so as to enhance the directivity of etching to the graphene film in the vertical direction, thereby improving the quality of patterning of the graphene film with micron-structure; (3) by adjusting the intensity and direction of the magnetic field (such as in a vertical direction), the moving direction of the oxygen excitons is controlled, and the shape of the etched pattern structure of the graphene film is controlled, and thus the purpose of controlling the patterning of the graphene film may be achieved.

First, the method of the present disclosure is implemented in a xenon lamp excimer ultraviolet photo-oxidation vacuum apparatus, wherein the xenon lamp excimer ultraviolet photo-oxidation vacuum apparatus comprises: a vacuum chamber with a control mechanism provided therein; a xenon lamp excimer discharge tube provided inside the vacuum chamber; wherein a water cooling device is provided in the xenon lamp excimer discharge tube, and the xenon lamp excimer discharge tube is connected with the control mechanism; and a sample holder, the sample holder is passed into the vacuum chamber by passing through the bottom of the vacuum chamber from outside, and the sample holder is arranged in parallel to the xenon lamp excimer discharge tube; an oxygen inlet, a nitrogen inlet and an exhaust port, the oxygen inlet, the nitrogen inlet and the exhaust port are arranged on side walls of the vacuum chamber, the oxygen inlet and are in communication with the inner cavity of the vacuum chamber; and a control system arranged on the vacuum chamber.

The xenon excimer discharge tube can emit ultraviolet light with a wavelength of 172 nm. The photon with this high-energy may not only decompose oxygen to oxygen excitons and ozone molecules, but also stimulate much more organic molecular materials, that is, the photon has greater oxidizing at room temperature under low partial pressure of oxygen. In the present disclosure, a xenon lamp excimer discharge tube capable of emitting ultraviolet light with a wavelength of 172 nm is used, and the gas filled in the vacuum chamber is mostly nitrogen with only a small amount of oxygen (less than 100 Pa, such as 10 Pa), and thus the patterning of large-area graphene film micron-structures may be achieved at room temperature.

Furthermore, by generating a non-uniform magnetic field in the vertical direction (such as permanent magnet of neodymium iron boron with S-N poles vertical to the graphene film), the paramagnetic oxygen excitons and oxygen are controlled to move toward the graphene film in the direction of the magnetic field, and the diamagnetic ozone molecules and nitrogen move in a direction away from the magnetic poles, thus significantly improving the quality of patterning of the graphene film. By controlling the intensity and direction of the magnetic field, the moving direction the oxygen excitons is controlled, and a pattern varied based on the structure of the mask may be obtained, that is, and the purpose of controlling the pattern structure by using the magnetic field is achieved. The hard mask is a common hard metal or ferromagnetic material, a semiconductor or an insulator, and the thickness thereof depends on size of the pattern structure.

The optical topographic image and the micro Raman spectroscopy research indicates that the patterning of large-area graphene films may be achieved by using xenon excimer ultraviolet photo-oxidation, and the pattern structure thereof is uniform; the quality of patterning of the graphene film is improved by applying a non-uniform magnetic field perpendicular to the direction of the graphene film; the graphic structure of the graphene film may also be adjusted by controlling the intensity and direction of the magnetic field.

Figure 2:
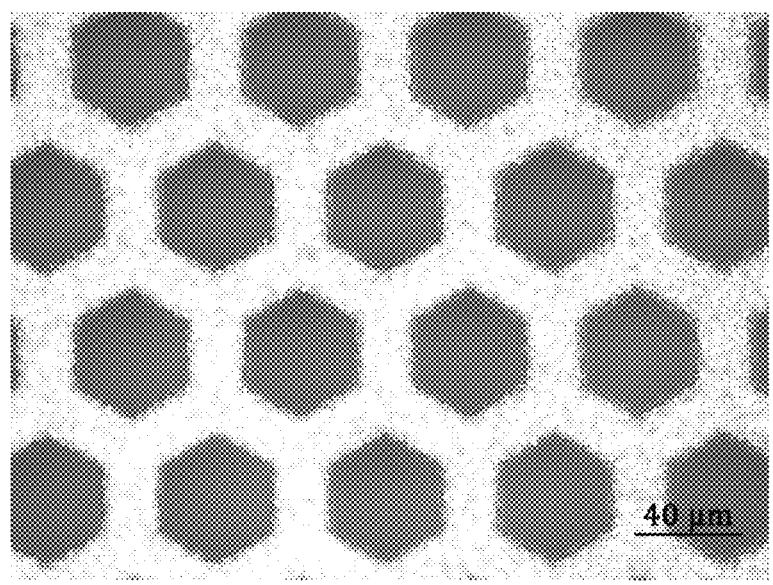
FIG. 2 is a pattern of a hard nickel mask.
Figure 3:
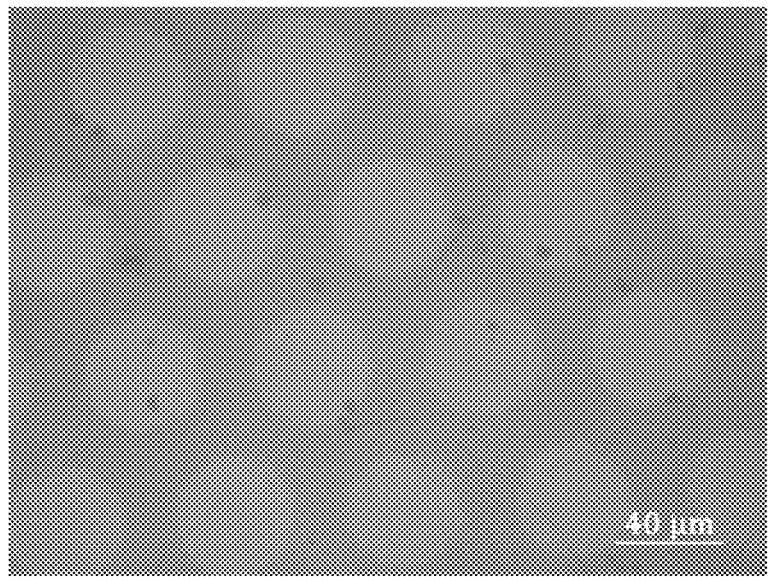
FIG. 3 is a pattern of the graphene film prepared by the hard nickel mask of FIG. 2 by using the xenon lamp excimer ultraviolet photo-oxidation method without a magnetic field.

The principle of patterning the graphene film described above will be described in details as follows:

As shown in FIG. 1, a hard nickel mask (as shown in FIG. 2, the thickness of which is 50 μm) is disposed on a graphene film, and a graphene film pattern obtained by xenon excimer ultraviolet photo-oxidation is shown in FIG. 3. It can be seen that a uniform micron-sized structural pattern may be generated with this method, and the dimensional error of the pattern structure and the mask structure may be controlled within 3 μm. However, there are the following problems: (1) the hexagonal structure has a certain distortion, that is, the consistency of the pattern structure and the mask needs to be improved; and (2) multilayer nucleus of the graphene film will not be completely etched in the process of patterning.

Figure 4:
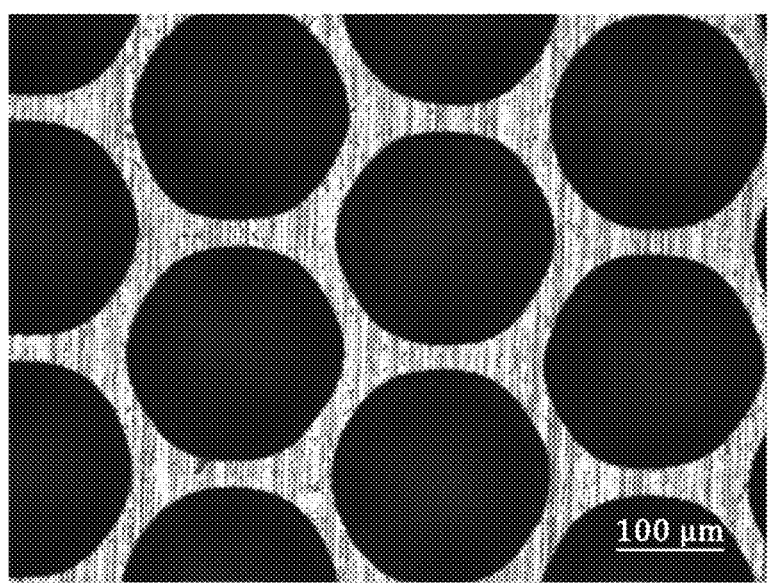
FIG. 4 is a pattern of a stainless-steel mask.
Figure 5:
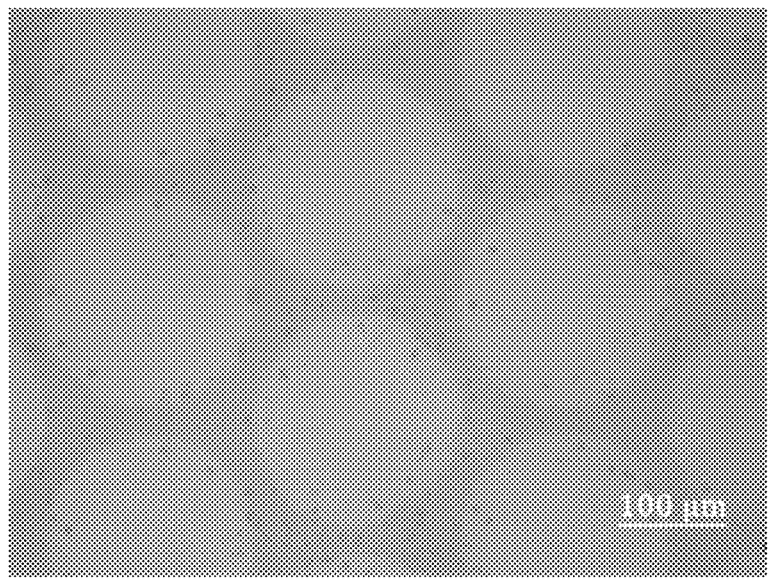
FIG. 5 is a pattern of the graphene film prepared by using a xenon lamp excimer ultraviolet photo-oxidation method and a stainless steel mask of FIG. 4 with a non-uniform magnetic field applied in a vertical direction of a substrate.

A ferromagnetic stainless steel mask (as shown in FIG. 4, the thickness of which is 50 μm) is disposed on a graphene film, and a permanent magnet of neodymium iron boron (the intensity of the magnetic field at both ends of S or N pole is about 350 mT) with a direction of the magnetic field perpendicular to the substrate is disposed under the support substrate $SiO_2$/Si (thickness of which is 500 μm); and the pattern structure of the graphene film prepared by using the xenon lamp excimer ultraviolet photo-oxidation method is shown in FIG. 5. It can be seen that this method could improve the quality of the graphic structure of the graphene film, and the consistency of the pattern structure with the mask is good.

Figure 6:
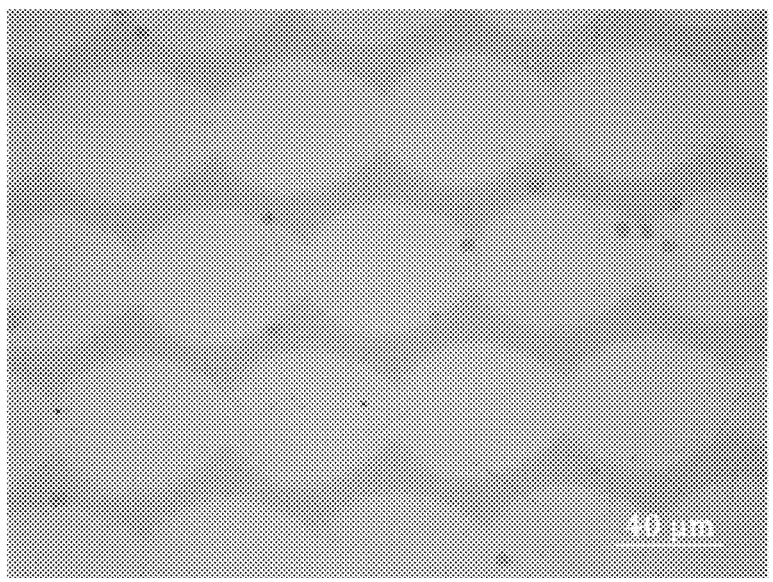
FIG. 6 is a pattern of the graphene film prepared by using xenon excimer ultraviolet photo-oxidation and the nickel mask of FIG. 2 with a non-uniform magnetic field applied parallel to the substrate.

The nickel hard mask shown in FIG. 2 (the magnetization direction thereof is in the plane direction) is disposed on the graphene film, and a permanent magnet of neodymium iron boron (which generates a non-uniform magnetic field in horizontal direction with a surface intensity of the magnetic field of about 18 mT and a gradient of 1 mT/mm) with a direction of the magnetic field in parallel to the graphene film the substrate is disposed under the support substrate $SiO_2$/Si; and the pattern structure of the graphene film prepared by the xenon lamp excimer ultraviolet photo-oxidation method is shown in FIG. 6. It can be seen that the oxygen excitons may move along the direction of the magnetic field on a graphene surface, which enhances the diffusion at the bottom of the mask in a direction parallel to the substrate, thereby obtaining a pattern structure which is quite different from that of FIG. 3 after oxidation and etching of the graphene film.

The results of Raman spectroscopy indicate that the quality of patterning of the graphene film is closely related to the mask itself, and a hard mask with smooth surface and sidewalls may significantly improve the quality of pattern structure of the graphene film. Specifically, it is possible to increase the steepness of the graphene film and reduce the damage to the graphene film caused by oxygen atomic undercutting. With a common nickel hard mask (such as a transmission electron microscope (TEM) nickel carrier), the patterning of graphene film grown and transferred by using a chemical vapor deposition (CVD) is implemented; the damage to the graphene film caused by oxygen atomic undercutting in the horizontal direction is generally less than 8 μm without magnetic confinement, which is lower than the damage to the graphene film caused by the hard mask and oxygen reactive ion etching as proposed by Keong Yong et al. (11 μm, Scientific Reports, Vol. 6, 24890, 2016). In addition, the quality of the patterning of the graphene film is improved by applying a non-uniform magnetic field perpendicular to the direction of the substrate; or the graphic structure of the graphene film is controlled by varying the intensity and direction of the magnetic field. Compared with the patterning of graphene films by laser etching, the method according to the present disclosure would not damage the substrate material, and the precision of patterns is relatively high (a pattern structure of few micron may be realized).

In short, the xenon lamp ultraviolet oxidation method could not only implement the patterning of the graphene film, but also regulate the graphic structure of the graphene film by confining the moving directivity of the oxygen excitons using the magnetic field. There are a series of advantages by using the patterning of graphene film according to the present disclosure: the precision of pattern is relatively high (in micrometer order), there is not any photoresist contamination or damage to the substrate, the operation is simple and the cost is relatively low, and the like, and thus it has important value and would be a milestone in the industrial application of graphene thin film components and integrated devices such as electrons, photons, optoelectronics and so on.

EXAMPLES

A method for implementing and controlling patterning of a graphene film by ultraviolet photo-oxidation, comprising the following steps:

Step 1, a hard mask with a certain pattern structure such as a ferromagnetic stainless steel plate (with a thickness of 50 μm) is closely disposed on a $SiO_2$/Si substrate transferred with a graphene film.

Step 2, the graphene film and the hard mask in Step 1 are disposed together in a ultraviolet photo-oxidation apparatus which takes a xenon lamp excimer discharge tube as a light source, and the distance between the sample and the lower surface of the xenon lamp excimer discharge tube is adjusted to be 20 mm, the oxygen pressure is adjusted to be 10 Pa, the pressure of nitrogen filled in the vacuum chamber is adjusted 1 atm, and it is irradiated with a xenon lamp excimer light source for 15 minutes.

Step 3, the graphene film and the hard mask in Step 1 are disposed on either pole of S-N of the permanent magnet of neodymium iron boron with a surface intensity of the magnetic field at 350 mT and a direction of the magnetic field perpendicular to the graphene film.

Step 4, repeating Step 2, the magnetic field vertical to the surface of the graphene film is used to constrain the moving direction of the oxygen excitons, improving the quality of the patterning of the graphene film by ultraviolet photo-oxidation of the xenon lamp.

Step 5, the intensity and direction of the magnetic field are varied (e.g., in the horizontal direction), and a nickel mask having the horizontal magnetization direction is used, and Steps 1 and 2 are repeated to further regulate the shape of the pattern structure of the graphene film.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for implementing and regulating patterning of a graphene film by ultraviolet photo-oxidation, comprising the steps of:

step 1: disposing a hard mask with a micron-scale pattern structure closely on a $SiO_2$/Si substrate transferred with a graphene film;

step 2: disposing the $SiO_2$/Si substrate transferred with the graphene film and the hard mask in the step 1 on a sample holder of a xenon lamp excimer ultraviolet photo-oxidation vacuum apparatus comprising a vacuum chamber filled with gases of nitrogen and oxygen; adjusting the distance between the sample holder and a lower surface of a xenon lamp excimer discharge tube that emits ultraviolet light to decompose molecules of the oxygen into oxygen excitons and ozone; and controlling the oxygen pressure of the xenon excimer ultraviolet photo-oxidation vacuum apparatus;

step 3: disposing a permanent magnet or other magnetic field generating devices under the $SiO_2$/Si substrate or at peripheral thereof to form a non-uniform magnetic field, so that a direction of the magnetic field is perpendicular to a surface of the graphene film, wherein paramagnetic oxygen excitons and paramagnetic oxygen molecules are controlled by the magnetic field to move toward the graphene film, while diamagnetic ozone molecules and the nitrogen are controlled by the magnetic field to move away from the graphene film; and step 4: regulating etching process for the graphene film by changing intensity and the direction of the magnetic field in the step 3 to be parallel to the surface of the graphene film to change moving direction and moving speed of the oxygen excitons and the oxygen, thereby obtaining patterns with different pattern structures.

2. The method for implementing and regulating patterning of the graphene film by ultraviolet photo-oxidation according to claim 1, wherein the material of the hard mask in the step 1 is one selected from the group consisting of metal, ferromagnetic material, semiconductor and insulator; and the hard mask has a thickness and the thickness of the hard mask is related to the pattern structure of the hard mask.

3. The method for implementing and regulating patterning of the graphene film by ultraviolet photo-oxidation according to claim 1, wherein the xenon lamp excimer ultraviolet photo-oxidation vacuum apparatus in the step 2 comprises:
the xenon lamp excimer discharge tube;
and the sample holder, wherein
the xenon lamp excimer discharge tube and the sample holder are located in the vacuum chamber;
the sample holder is located under the xenon lamp excimer discharge tube; and
inlets and outlets for oxygen and nitrogen are provided at a side of the vacuum chamber, respectively.

4. The method for implementing and regulating patterning of the graphene film by ultraviolet photo-oxidation according to claim 1, wherein a wavelength of ultraviolet light emitted by the xenon lamp excimer discharge tube in the step 2 is 172 nm; and the oxygen pressure does not exceed 100 Pa.

5. The method for implementing and regulating patterning of the graphene film by ultraviolet photo-oxidation according to claim 1, wherein
the permanent magnet in the step 3 is neodymium iron boron; and
the permanent magnet has a S pole or a N pole, and the S pole or the N pole of the permanent magnet is disposed to face the graphene film.

6. The method for implementing and regulating patterning of the graphene film by ultraviolet photo-oxidation according to claim 1, wherein the hard mask in the step 1 is made of a hard material which is opaque in a vacuum ultraviolet band;
the surface and side walls of the hard mask are smooth; and
if a magnetic field perpendicular to the surface of the graphene is applied, the hard mask is also made of a material transparent to the vacuum ultraviolet band as the magnetic field has a binding ability to the oxygen excitons.

7. The method for implementing and regulating patterning of the graphene film by ultraviolet photo-oxidation according to claim 1, wherein in the step 4, the moving direction and the moving speed of oxygen excitons and oxygen are varied by a non-uniform magnetic field, so that an ultraviolet photo-oxidation process is regulated to obtain a graphene film pattern with a pattern structure different from that of the hard mask.

8. The method for implementing and regulating patterning of the graphene film by ultraviolet photo-oxidation according to claim 1, wherein a light source for generating ultraviolet light in the step 2 comprises: a light source capable of decomposing oxygen to oxygen atoms, and the light source can be a low pressure mercury lamp; and
wherein the other magnetic field generating devices in the step 3 comprises a carrier capable of providing a non-uniform magnetic field, and the carrier can be a device for generating a magnetic field through an electromagnetic effect.

9. The method for implementing and regulating patterning of the graphene film by ultraviolet photo-oxidation according to claim 3, wherein a wavelength of ultraviolet light emitted by the xenon lamp excimer discharge tube in the step 2 is 172 nm.

* * * * *